United States Patent
Beyer et al.

(10) Patent No.: US 10,086,370 B2
(45) Date of Patent: Oct. 2, 2018

(54) MICROFLUIDIC DEVICE AND METHOD

(71) Applicant: Infineon Technologies AG, Neubiberg (DE)

(72) Inventors: Stefan Beyer, Villach (AT); Dietrich Bonart, Bad Abbach (DE)

(73) Assignee: Infineon Technologies AG, Neubiberg (DE)

( * ) Notice: Subject to any disclaimer, the term of this patent is extended or adjusted under 35 U.S.C. 154(b) by 227 days.

(21) Appl. No.: 13/763,404

(22) Filed: Feb. 8, 2013

(65) Prior Publication Data

US 2014/0227147 A1    Aug. 14, 2014

(51) Int. Cl.

| B01L 3/00 | (2006.01) |
| H01L 21/56 | (2006.01) |
| B81C 1/00 | (2006.01) |
| H01L 23/00 | (2006.01) |

(52) U.S. Cl.
CPC .... B01L 3/502707 (2013.01); B81C 1/00119 (2013.01); H01L 21/56 (2013.01); H01L 24/19 (2013.01); H01L 24/96 (2013.01); *B81B 2201/051* (2013.01); *H01L 21/568* (2013.01); *H01L 2224/04105* (2013.01); *H01L 2224/48091* (2013.01); *H01L 2924/12042* (2013.01); *H01L 2924/1461* (2013.01)

(58) Field of Classification Search
CPC .... B01L 3/502707; H01L 24/96; H01L 24/19; H01L 21/56; H01L 2924/12042; H01L 2224/04105; H01L 21/568; H01L 2924/1461; H01L 2224/48091; B81C 1/00119; B81B 2201/051

See application file for complete search history.

(56) References Cited

U.S. PATENT DOCUMENTS

| 6,123,316 A * | 9/2000 | Biegelsen ............... B32B 3/10 251/129.01 |
| 6,136,212 A * | 10/2000 | Mastrangelo et al. .......... 216/49 |
| 6,525,343 B1 * | 2/2003 | Tanga .................. B01J 19/0046 257/252 |
| 2011/0229375 A1 | 9/2011 | Ehrenpfordt et al. |

FOREIGN PATENT DOCUMENTS

| EP | 2269947 A2 | 1/2011 |
| JP | 200658280 A | 3/2006 |
| WO | 9833585 A1 | 8/1998 |

OTHER PUBLICATIONS

Thorsen, T., et al., "Microfluidic Large-Scale Integration," Science, vol. 298, Oct. 18, 2002, pp. 580-584.

Hong, J.W., et al., "A nanoliter-scale nucleic acid processor with parallel architecture," Nature Biotechnology, vol. 22, No. 4, Apr. 2004, pp. 435-439.

* cited by examiner

*Primary Examiner* — Lore R Jarrett

(74) *Attorney, Agent, or Firm* — Slater Matsil, LLP

(57) ABSTRACT

A microfluidic device includes a semiconductor chip having a main chip surface. The microfluidic device further includes an encapsulation body embedding the semiconductor chip, the encapsulation body having a main body surface. A microfluidic component extends over the main chip surface and over the main encapsulation body surface and traverses an outline of the main chip surface.

20 Claims, 8 Drawing Sheets ns in which is shown by way of illustration specific embodiments in which the invention may be practiced. In this regard, directional terminology, such as "top," "bottom," "front," "back," "above," "beneath," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

As employed in this specification, the terms "connected" and/or "electrically connected" and/or "fluidically connected" are not meant to mean that the elements must be directly connected together; intervening electrical or fluidic elements may be provided between the "connected" or "electrically connected" or "fluidically connected" elements. However, although not restricted to this meaning, the term "connected" and/or "electrically connected" and/or "fluidically connected" may also be understood to optionally disclose an implementation in which the elements are directly connected together without intervening elements provided between the "connected" or "electrically connected" or "fluidically connected" elements. This applies both to electrical and fluidic connection or coupling.

Embodiments of devices which may contain one or more semiconductor chips are described below. The semiconductor chips may be of different types and may be manufactured by different technologies. The semiconductor chips may, for example, be designed as logic integrated circuits, analog integrated circuits, mixed signal integrated circuits, memory circuits, power circuits, in particular discrete power transistors, integrated passives or discrete passives. They may include control circuits, evaluation circuits, microprocessors, micro-electromechanical (MEMS) components, electro-optical components, sensor components, actuator components, etc. The semiconductor chips need not be manufactured from specific semiconductor material, for example Si, SiC, SiGe, GaAs, AlGaAs and, furthermore, may contain inorganic and/or organic materials that are not semiconductors, such as for example insulators, plastics or metals.

The microfluidic devices described herein include fluidic components such as, e.g., microfluidic channels, microfluidic valves, microfluidic multiplexors, microfluidic reaction chambers, microfluidic buffers, microfluidic networks, etc. The microfluidic components may be arranged in a layer made of an dielectric material such as, e.g., an oxide, a nitride, an elastomer, e.g., a silicone elastomer such as, e.g., polydimethylsiloxane (PDMS), plastics, or an polymer such as, e.g., an imid, a photoresist (e.g., SU8), etc.

The microfluidic components described herein may, e.g., be arranged in one or more than one layers. If arranged in more than one layer, a first of the at least two layers may be a microfluidic flow layer. A second of the at least two layers may be a microfluidic flow control layer. The fluidic transport portion of the microfluidic component located in the first layer and/or the control portion of the microfluidic component located in the second layer may be accessible from outside of the package. Thus, fluidic contact may be made with the microfluidic device from outside the package

MICROFLUIDIC DEVICE AND METHOD

TECHNICAL FIELD

This invention relates to a microfluidic device, and in particular to a microfluidic device including a microfluidic component and an electronic component.

BACKGROUND

Microfluidic devices are currently developed for use in chemical, biological, medical or diagnostic applications. In particular, microfluidic components may be integrated in a semiconductor chip. Integrated microfluidic devices offering low expenses, high functionality and small sizes are desired.

For these and other reasons there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION OF ILLUSTRATIVE EMBODIMENTS

Figure 1:
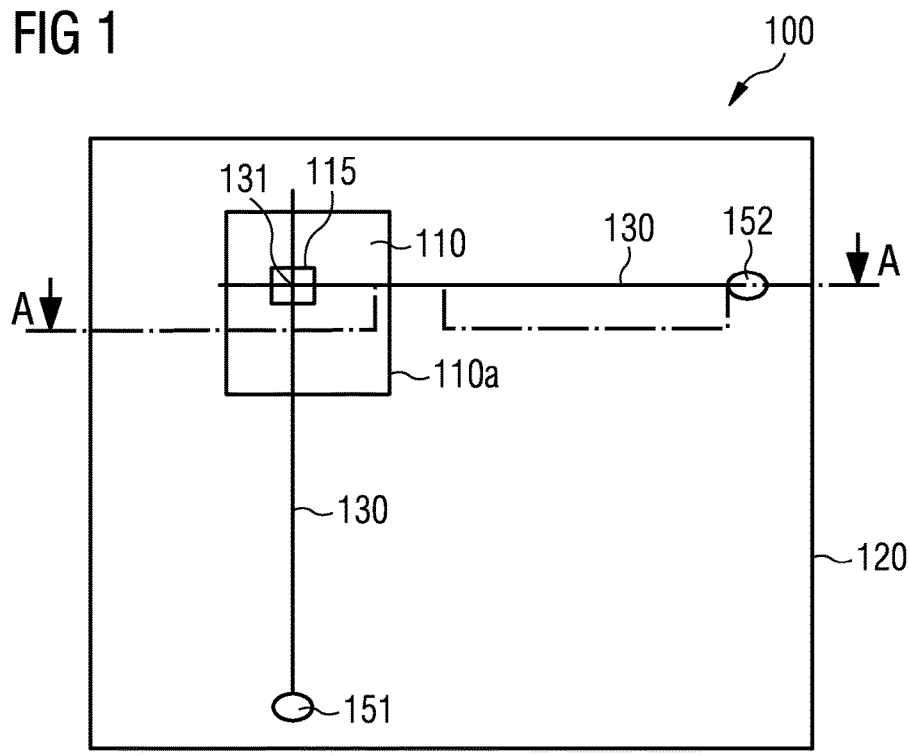
FIG. 1 schematically illustrates a top view on an exemplary microfluidic device showing the internal components thereof.

In the following detailed description, reference is made to the accompanying drawings, which form a part thereof, and via fluid ports and/or control operation may be performed on the microfluidic device from outside the package via control ports.

The microfluidic devices described herein may include external electrical contact elements such as, e.g., leads or solder deposits or contact pads on package. The external electrical contact elements may represent the external terminals of the package. They may be accessible from outside the package and may thus allow electrical contact to be made with the device from outside the package. The external electrical contact elements may be composed of any desired electrically conductive material, for example of a metal, such as copper, aluminum or gold, a metal alloy or an electrically conductive organic material. Solder deposits, such as solder balls or solder bumps, may represent the external contact elements or may be deposited on the external contact elements.

The microfluidic devices described herein comprise an encapsulating material to form an encapsulation body (e.g., a molded body, a laminated body, a plastic body), which may be electrically insulating. The encapsulating material may be a dielectric material and may be made of any appropriate duroplastic, thermoplastic or thermosetting material or laminate (prepreg). The encapsulating material may contain filler material. After its application, the encapsulating material may be only partially hardened and may be completely hardened by application of energy (e.g., heat, UV light, etc.) to form the encapsulation body. Various techniques may be employed to embed the semiconductor chip(s) in the encapsulation body, for example compression molding, injection molding, powder molding, liquid molding, dispensing, laminating, or other techniques.

The encapsulation body may be used to produce so-called fan-out type packages. In a fan-out type package at least some of the conductor traces connecting the semiconductor chip to the external contact elements are located laterally outside of the outline of the semiconductor chip or do at least intersect the outline of the semiconductor chip. Thus, in fan-out type packages, a peripherally outer part of the package of the semiconductor chip is typically (additionally) used for electrically bonding the package to external applications, such as, e.g., application boards. This outer part of the package encompassing the semiconductor chip effectively enlarges the contact area of the package in relation to the footprint of the semiconductor chip(s) embedded in the package, thus leading to relaxed constraints in view of package pad size and pitch with regard to later processing, e.g., second level assembly.

In a fan-out type package of a microfluidic device as described herein, at least some of the microfluidic components are located laterally outside of the outline of the semiconductor chip(s) or do at least intersect the outline of the semiconductor chip(s). Thus, a peripherally outer part of the package of the semiconductor chip is additionally used for microfluidic transport and/or other microfluidic functions. By way of example, microfluidic components such as, e.g., microfluidic channels, microfluidic valves, microfluidic multiplexors, microfluidic reaction chambers, microfluidic buffers, microfluidic networks, etc. may extend across the part of the package located laterally outside of the outline of the semiconductor chip(s). In particular, one or more fluid input port(s) and/or one or more fluid output port(s) of the device may be located laterally outside of the outline of the semiconductor chip(s). The part of the package located laterally outside of the outline of the semiconductor chip(s) may comprise or be made of encapsulating material, i.e., may form part of the encapsulation body. Following one or more of these concepts, a high degree of design flexibility in view of the fluidic on-device interconnect/network and/or the electrical on-device interconnect/wiring may be obtained. That way, low cost and modular devices may be fabricated.

Microfluidic devices described herein may be configured for a variety of different applications and functions, including chemical and/or biological and/or medical processing and/or analysis. By way of example, the microfluidic devices may be configured for cell analysis, e.g., purification and/or isolation of nucleic acids from cells, e.g., bacterial cells, mammalian cells, etc., in particular purification and/or isolation of DNA or mRNA. Further, the microfluidic devices described herein may each have a plurality of functions and may, e.g., integrate batch-processing functionalities for, e.g., chemical and/or biological and/or medical applications. Thus, a microfluidic device described herein may represent what is referred to in the art as a "lab-on-chip."

The microfluidic devices described herein may be configured to process small volumes of the fluids. They may, e.g., be configured for nanoliter processes or for picoliter processes.

FIG. 1 illustrates by way of example a top view of an exemplary microfluidic devices showing the internal components thereof. The microfluidic device comprises a semiconductor chip 110 embedded in an encapsulation body 120. Further, the microfluidic device 100 contains at least one microfluidic component 130 extending over the semiconductor chip 110 and the encapsulation body 120.

Figure 2:
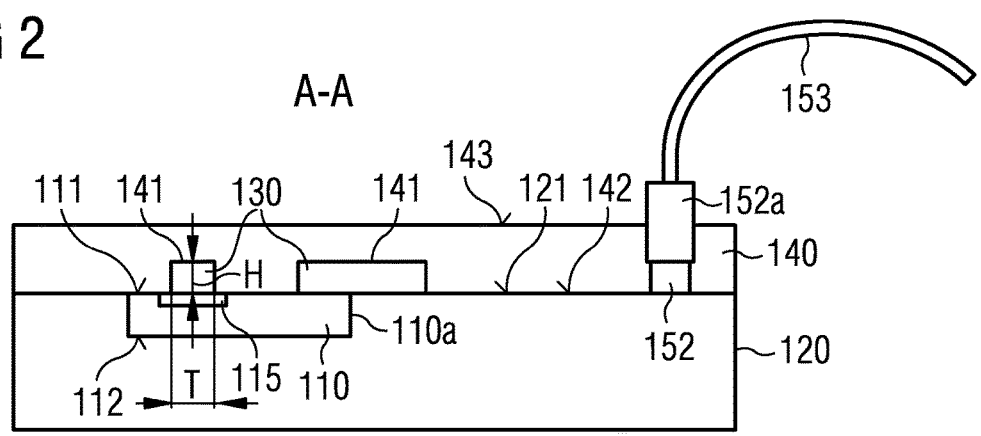
FIG. 2 schematically illustrates a cross-sectional view along line A-A of the exemplary microfluidic device of FIG. 1.

FIG. 2 is a schematic, cross-sectional view of the microfluidic device 100 along line A-A of FIG. 1. The semiconductor chip 110 has a first main chip surface 111 and the encapsulation body 120 has a first main encapsulation body surface 121. An outline of the first main chip surface 111 is denoted by reference numeral 110a. As apparent from FIGS. 1 and 2, the microfluidic component 130 traverses the outline 110a of the semiconductor chip 110 when extending from the encapsulation body 120 to the semiconductor chip 110.

The microfluidic component 130 may be formed in a structured layer 140 arranged above the first main chip surface 111 and the first main encapsulation body surface 121. To that end, a lower surface 142 of the structured layer 140, which faces the first main chip surface 111 and the first main encapsulation body surface 121, may be provided with recess or channel structures 141 in order to provide flow cross-sections for fluid to be transported through the structured layer 140.

By way of example, the first main chip surface 111 and the first main encapsulation body surface 121 may level with each other. The first main chip surface 111 and the first main encapsulation body surface 121 may be laterally adjacent to each other, i.e., the outline 110a of the first main chip surface 111 may be a transition line between the first main chip surface 111 and the first main encapsulation body surface 121.

A second main chip surface 112 opposed to the first main chip surface 111 may be completely covered by the encapsulating material of the encapsulation body 120. Further, the side surfaces of the semiconductor chip 110 may, e.g., be completely covered by the encapsulating material of the encapsulation body 120.

By way of example, the microfluidic component 130 may be a microfluidic channel. In FIGS. 1 and 2, by way of example, two microfluidic channels fluidically interconnected by a crossing 131 are shown. However, the microfluidic component 130 may also be designed as a microfluidic valve, a microfluidic multiplexor, a microfluidic mixer, a microfluidic reaction chamber, a microfluidic buffer, a microfluidic network, etc.

The microfluidic device 100 may have a fluid input port 151. Further, the microfluidic device 100 may have a fluid output port 152. By way of example, the fluid input port 151 and/or the fluid output port 152 may be provided by a fluid input pin (not shown) and/or a fluid output pin 152a received in the structured layer 140 and configured to fluidically connect the microfluidic component 130 to external applications via, e.g., a fluid pipe 153.

The structured layer 140 may comprise or be made of various different materials, e.g., an elastomer such as, e.g., PDMS, a polymer layer such as, e.g., an imide or a photoresist or a hard structure such as, e.g., an oxide layer, a nitride layer, glass, etc.

Here and in other applications the microfluidic component 130 may have a minimum lateral dimension T of, e.g., 1 µm, 3 µm, 5 µm, 10 µm, 20 µm or 50 µm. The maximum lateral dimension T may, e.g., be less than 200 µm, 150 µm, 100 µm, 50 µm, 30 µm, 10 µm. The microfluidic component 130 may have a minimum vertical dimension H of, e.g., 1 µm, 3 µm, 5 µm and may have a maximum vertical dimension H of, e.g., less than 20 µm, 15 µm, 10 µm.

The semiconductor chip 110 may have an active region 115 located at the first chip surface 111 in the vicinity, e.g., beneath the microfluidic component 130. The active region 115 may be an integrated device such as, e.g., a sensor, a micro-mechanical actuator, an emitter, etc. In particular, the active region 115 may comprise an optical sensor, a mechanical sensor, e.g., a flow sensor, a sensor for measuring the electric conductivity, a temperature sensor, a chemical sensor etc. Examples for an emitter located in the active region 115 are a radiation emitter such as, e.g., a light source or a heat source. Further, the active region 115 may incorporate a pump, a valve, a passive channel and/or integrated circuitry such as, e.g., a control logic for controlling, e.g., the micro-mechanical actuator or the emitter, and/or an integrated evaluation logic for evaluating an electrical sensor signal indicative of a sensed microfluidic quantity.

In FIGS. 1 and 2 neither the external electrical contact elements of the microfluidic device 100 (e.g., the package contact pads or wires) nor the semiconductor chip electrodes are shown. Further, electrical conductors interconnecting the chip electrodes to the external electric contact elements of the device 100 (package) are not shown. Generally, these electric components may be configured as desired by the package designer. By way of example, as will be exemplified in more detail further below, the electrical conductors interconnecting the chip electrodes and the external electrical contact elements of the package may be designed as a redistribution layer (RDL). However, other possibilities of implementing an electrical interconnect are also feasible, e.g., wire bonding, clip bonding, etc.

Figure 3:
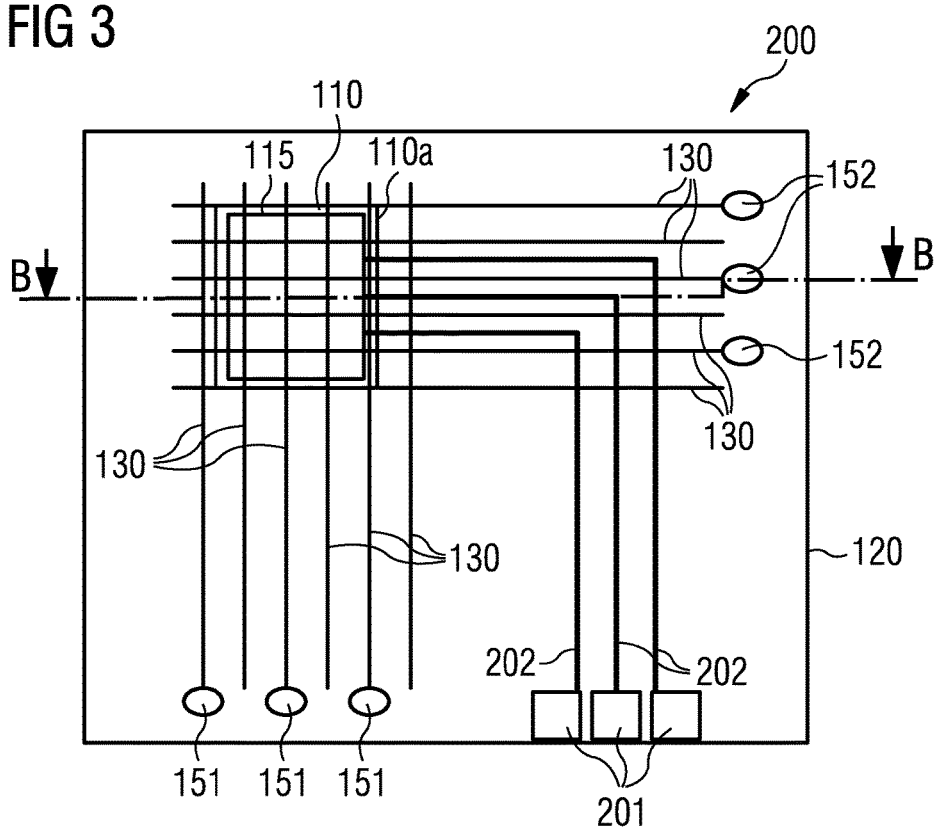
FIG. 3 schematically illustrates a top view on an exemplary microfluidic device showing the internal components thereof.
Figure 4:
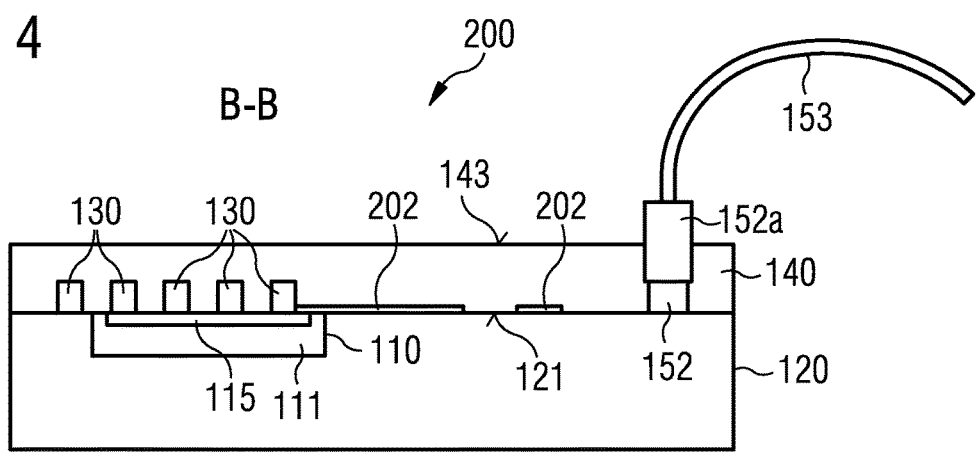
FIG. 4 schematically illustrates a cross-sectional view along line B-B of the exemplary microfluidic device of FIG. 3.

FIGS. 3 and 4 are illustrations similar to FIGS. 1 and 2, respectively, and illustrate a microfluidic device 200. Here and throughout the entire description, implementations described by way of example in conjunction with FIGS. 1 and 2 also apply to the microfluidic devices explained below, and reference is made to the description above for the sake of brevity. Vice versa, implementations and details described below may also relate to microfluidic device 100.

In FIG. 3 an array of multiple microfluidic components 130 is shown. By way of example, the array may comprise a plurality of crossings 131 between microfluidic channels 130 running from south to north and microfluidic channels 130 running from east to west.

Referring to FIG. 3, the microfluidic device 200 may comprise a plurality of external contact elements 201, e.g., contact pads, pins or wires. The external contact elements 201 may be exposed at the periphery of the encapsulation body 120. The external contact elements 201 may be connected via an interconnect such as, e.g., conductor traces 202 to the semiconductor chip 110. More specifically, the conductor traces 202 may be electrically connected to chip electrodes on the semiconductor chip 110.

As it is shown by way of example in FIG. 4, the conductor traces 202 may extend over the first main chip surface 111 and over the first main encapsulation body surface 121. They may extend beneath the structured layer 140. At crossings between the microfluidic components 130 (e.g., microfluidic channels) and the conductor traces 202, the conductor traces 202 may, e.g., run beneath the microfluidic components 130. As will be explained in more detail further below, the conductor traces 202 may be implemented by an electrical redistribution structure composed of a structured metal layer (RDL) sandwiched, e.g., between two polymer layers. However, it is also possible that the structured layer 140 is provided with through-holes or vias extending from the upper surface 143 of the structured layer 140 to chip electrodes, and that the external contact elements and/or the wiring configured to interconnect the through-holes or vias to the external contact elements of the microfluidic device 200 are arranged at the upper surface 143 of the structured layer 140.

Figure 8:
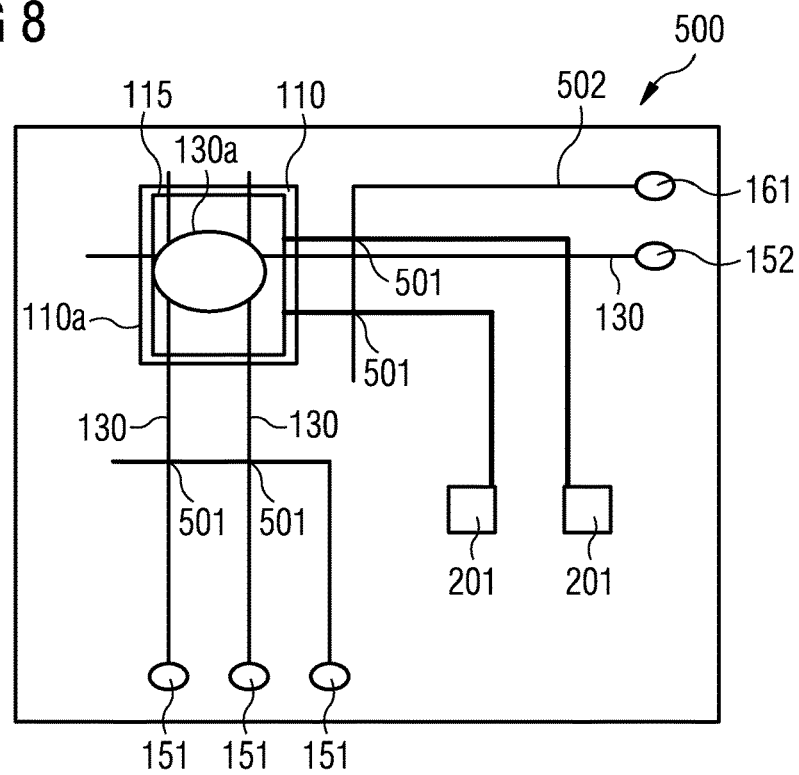
FIG. 8 schematically illustrates a top view on an exemplary microfluidic device showing the internal components thereof.
Figure 9:
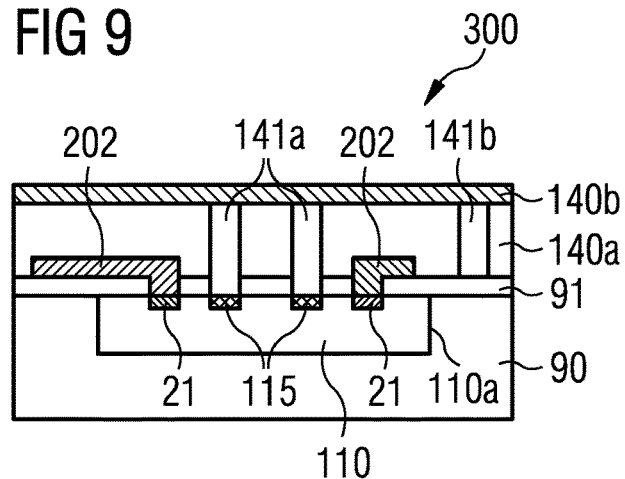
FIG. 9 schematically illustrates a partial cross-sectional view of an exemplary microfluidic device produced, e.g., by the method illustrated in FIGS. 5A to 5K.

FIGS. 5A-5K schematically illustrate a method of manufacturing, e.g., a microfluidic device 300, a cross-section of which is shown in FIG. 9. However, the method exemplified by FIGS. 5A-5K may likewise be used to produce microfluidic devices 100, 200, 400, 500, 600, 700 as illustrated in FIGS. 1-4 and 7-11. The details of the exemplary production method, that are described below, can therefore be applied to various processes to produce the microfluidic devices 100, 200, 400, 500, 600, 700.

Figure 5A:
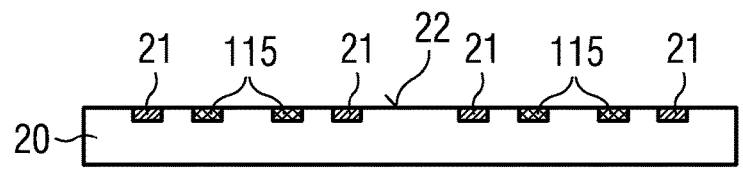
FIGS. 5A to 5K schematically illustrate cross-sectional views of an exemplary method to produce a microfluidic device.

As illustrated in FIG. 5A, a semiconductor wafer 20 may include multiple active regions 115 and multiple chip electrodes 21. Each active region 115 may be configured as described above, e.g., as an integrated device such as, e.g., an actuator, MEMS, sensor, integrated circuit, etc. The chip electrodes 21 may be made of metal, for example aluminum or copper or any other metal mentioned above with reference to chip electrodes 21.

Figure 5B:

According to FIG. 5B, the semiconductor wafer 20 may then be singulated into the semiconductor chips 110, for example by sawing, cutting, etching or laser ablation. Each semiconductor chip 110 may include one or more active regions 115 (e.g., integrated devices) and one or more chip electrodes 21.

Figure 5C:
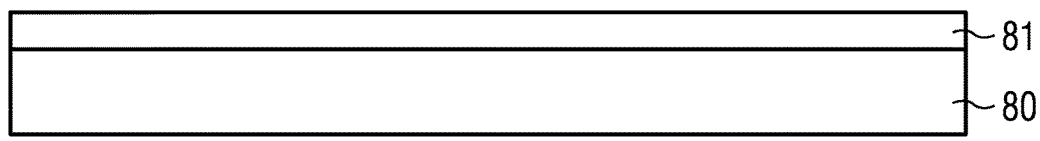

In order to package the semiconductor chips 110, a temporary carrier 80 may be provided as illustrated FIG. 5C. The temporary carrier 80 may be a plate of a rigid material, for example a metal such as nickel, steel or stainless steel, laminate, film or material stack. The temporary carrier 80 may have at least one flat surface on which the semiconductor chips 110 may be placed. An adhesive tape 81, for example, a double-sided sticky tape, may be laminated on the temporary carrier 80.

Figure 5D:
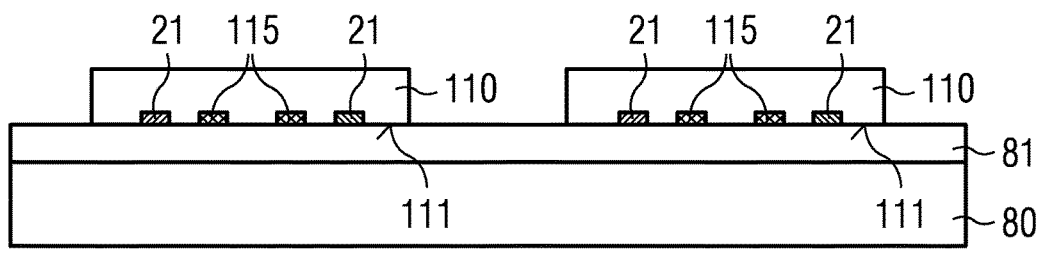

As illustrated in FIG. 5D, the semiconductor chips 110 are mounted on the temporary carrier 80. The semiconductor chips 110 can be fixed on the adhesive tape 81. For attaching the semiconductor chips 115 to the temporary carrier 80, other kinds of attaching materials or devices such as, e.g., vacuum holders may also be used.

Figure 6:
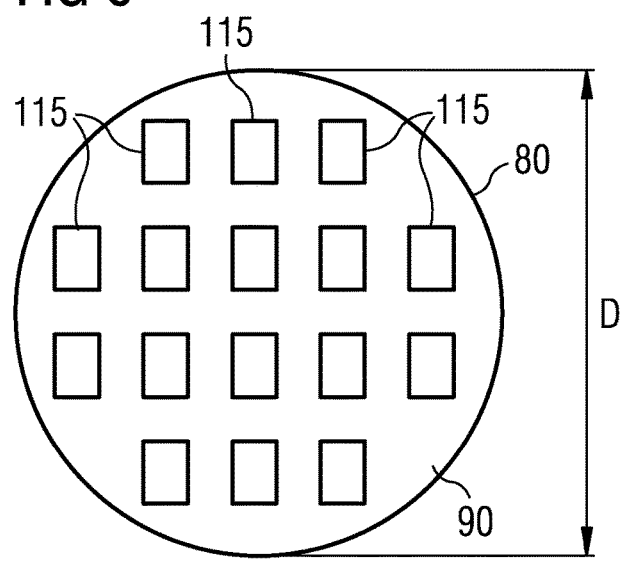
FIG. 6 schematically illustrates a bottom view of the structure illustrated in FIG. 5F.

As shown in FIG. 6, the semiconductor chips 110 may be arranged in an array, with the semiconductor chips 110 being spaced apart from each other in a certain distance. The temporary carrier 80 may be round (see, e.g., FIG. 6) or square shaped. The temporary carrier 80 may have any appropriate size, e.g., a diameter D of about 0.2 or 0.3 m or more.

Referring again to FIG. 5D, the semiconductor chips 115 may be arranged over the temporary carrier 80 with their first main chip surfaces 111 containing the chip electrodes 21 and the active regions 115 facing the temporary carrier 80.

Figure 5E:
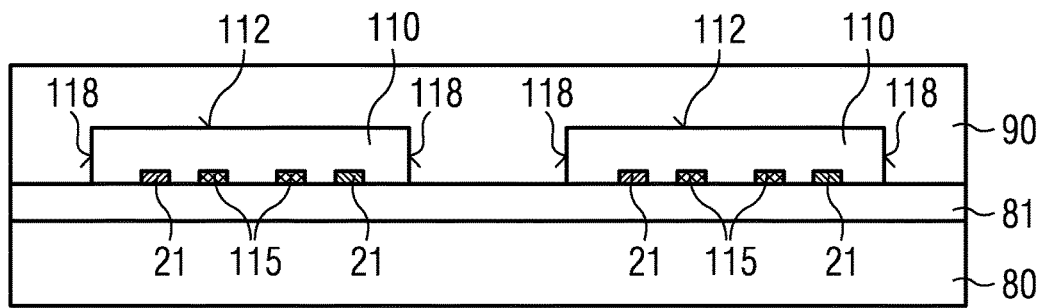

After the semiconductor chips 110 have been mounted on the temporary carrier 80, they may be encapsulated with an encapsulating material forming an encapsulant 90 as illustrated in FIG. 5E. The encapsulating material may cover the second main chip surfaces 112 and also the side faces 118 of the semiconductor chips 110. The gaps between the semiconductor chips 110 are also filled with the encapsulating material. For example, the encapsulating material may be a duroplastic or film-resetting mold material. The encapsulating material may be based on an epoxy material and may contain a filler material consisting of small particles of glass ($SiO_2$) or other electrically insulating mineral filler materials like $Al_2O_3$ or organic filler materials. The mold material may, for example, be applied by compression molding, injection molding, granulate molding, powder molding or liquid molding.

The encapsulating material may also have the shape of an electrically insulating foil or sheet, which is laminated on top of the semiconductor chip 110 as well as the temporary carrier 80. Also in this case, the gaps between the semiconductor chips 110 are filled with the encapsulating material. The encapsulating material, e.g., a polymer material, may, for example, be a prepreg (short for pre-impregnated fibers) that is a combination of a fiber mat, for example glass or carbon-fibers, and a resin, for example duroplastic material. For the lamination of a prepreg the same or similar process steps can be used as in PCB (Printed Circuit Board) manufacturing.

Figure 5F:
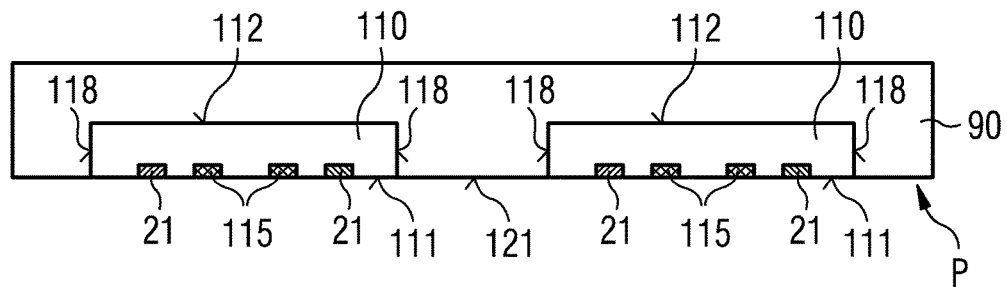

The semiconductor chips 110 encapsulated in the encapsulant 90 are then released from the temporary carrier 80 as illustrated in FIG. 5F. The adhesive tape 81 may feature thermo-release properties, which allow for the removal of the adhesive tape 81 during a heat treatment. Appropriate temperature used for removing the adhesive tape 81 depend on the thermo-release properties of the adhesive tape 81 and may typically be higher than 150° C.

After the release of the temporary carrier 80 and the adhesive tape 81, the first main chip surface 111 and the first main surface 121 of the encapsulant 90 may form a substantially common plane P. The structure shown in FIG. 5F is referred to as an artificial wafer in the art. It may be used as a wafer-level building platform for further processing. As will be described below and illustrated in FIGS. 5G-5K in greater detail, a RDL or redistribution structure and/or a structured layer containing the microfluidic components 130 may be applied to the plane P of the artificial wafer.

Figure 5G:
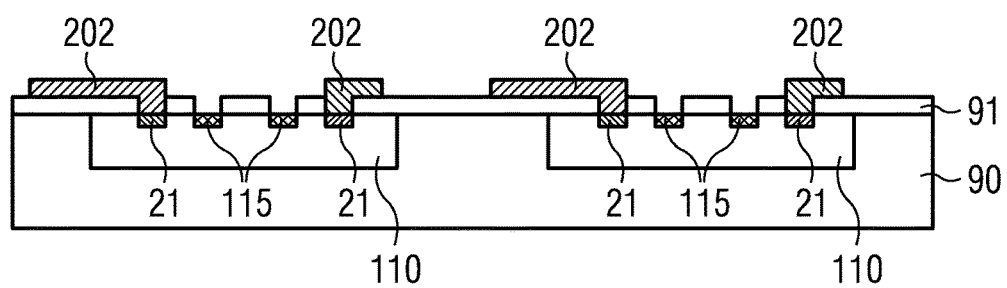

Referring to FIG. 5G, a dielectric layer 91 may be deposited on the plane P. The dielectric layer 91 may be fabricated in various ways. For example, the dielectric layer 91 may be deposited from a gas phase or from a solution, or can be laminated onto the surface of plane P. Furthermore, thin-film technology methods may be used for the application of the dielectric layer 91. The dielectric layer 91 may be fabricated from a polymer such as, e.g., parylene, photoresist material, imide, epoxy, duroplast, silicone, silicone nitride or an inorganic, ceramic-like material such as, e.g., silicon-carbon compounds. The dielectric layer 91 may also be omitted.

In order to make electrical contacts to the integrated devices at the active region 115, the dielectric layer 91 may be opened in areas where the chip electrodes 21 are arranged. These openings above chip electrodes 21 may, for example, be produced by using photolithographic methods and/or etching methods.

A metal layer may be applied above plane P and, more particularly, e.g., onto the dielectric layer 91 and is structured to provide an electrical interconnect such as, e.g., conductor traces 202. According to one embodiment, the metal layer may be fabricated by a plating process. By way of example, a seed layer (not shown) may be deposited onto the dielectric layer 91 and may be covered by a photoresist layer (not shown) structured by a photolithographic process. Subsequently, the portion of the seed layer exposed by the photoresist layer may be reinforced by galvanic deposition of a metallic material. Copper or other metals or metal alloys may be plated on the seed layer in the unmasked areas and to the desired height, e.g., 2 μm or more. That way, conductor traces 202 may be fabricated.

Further, depending on the type of the integrated device located in the active region 115, the dielectric layer 91 may be opened in an area located above the active region(s) 115. By way of example, opening the dielectric layer 91 above the active region 115 may be necessary if the active region 115 needs to get in contact with the fluid to be analyzed or processed in the microfluidic device.

Figure 5H:
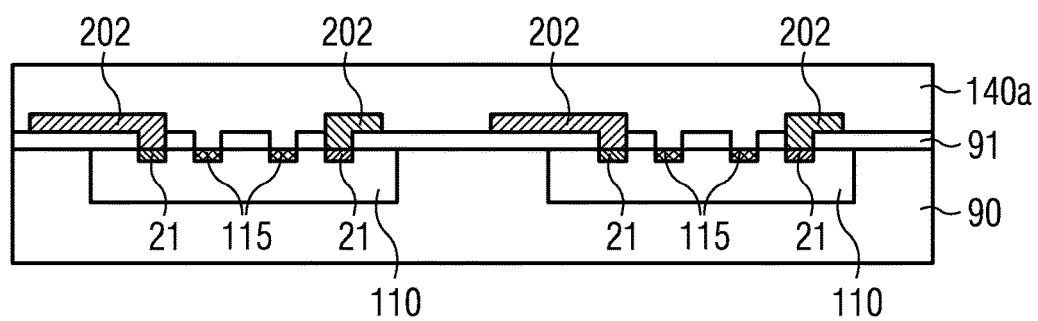

Referring to FIG. 5H, a microfluidic component layer 140a may be applied over the arrangement shown in FIG. 5G. The microfluidic component layer 140a may be made of materials as mentioned before with reference to the structured layer 140. The microfluidic component layer 140a may be applied by, e.g., gas phase depositing techniques, printing, spin-coating, laminating, etc.

Figure 5I:
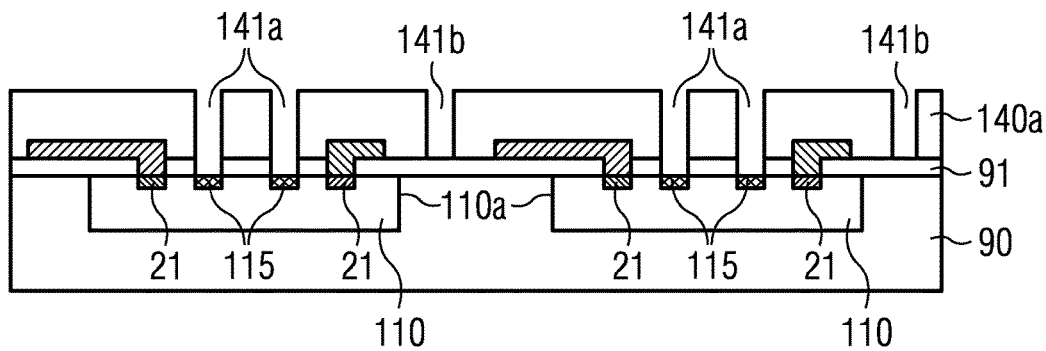

As shown in FIG. 5I, the microfluidic component layer 140a may then be structured in order to provide for microfluidic components 130. Structuring of the microfluidic component layer 140a may be performed by, e.g., lithographic methods, in particular multi-layer soft lithography which may provide robust and accurate micro-mechanical structures in the microfluidic component layer 140a. That way, a microfluidic architecture comprising various microfluidic components 130 such as valves, pumps, channels, multiplexors, reaction chambers, buffers or networks may be designed in the microfluidic component layer 140a. By way of example, the recess structure formed in the microfluidic component layer 140a may comprise first recess structures 141a located above and optionally in fluidical contact with the active regions 115 and, e.g., the integrated devices located therein, and may contain second recess structures 141b located above the encapsulating material of the encapsulant 90, i.e., laterally outside of the outline 110a of the semiconductor chip 110. While first recess structures 141a may form microfluidic components 130 coupled to active regions 115, e.g., integrated devices such as, e.g., sensors, emitters, actuators, etc., second recess structures 141b may be provided to form microfluidic components 130 used for flow transport and/or flow control, e.g., channels, valves, etc.

Figure 5J:
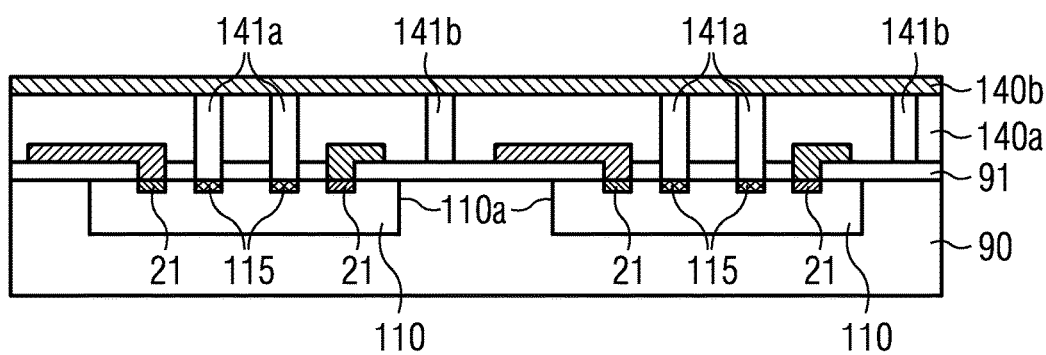

Referring to FIG. 5J, the recess structures 141a and/or 141b provided in the microfluidic component layer 140a may be closed by a lid 140b. The lid 140b may be a thin plate, e.g., a glass plate, a plastic plate, etc. The lid 140b may seal the recess structure 141a, 141b from the environment.

The microfluidic component layer 140a closed by the lid 140b may provide for the structured layer 140 as shown in FIGS. 2 and 4. However, there are other possibilities to produce a structured layer 140 containing microfluidic components 130. By way of example, instead of applying an unstructured microfluidic component layer 140a (FIG. 5H) and structuring (FIG. 5I) and closing (FIG. 5J) this layer, a pre-structured layer 140 having a pre-formed recess structure 141, as shown in FIG. 2, may be produced and applied in an aligned relationship on the arrangement shown in FIG. 5G. The pre-structured layer 140 may, e.g., be integral or may be made of multiple layers such as, e.g., the microfluidic component layer 140a and the lid 140b as shown in FIG. 5J. Thus, although a sequential building process as shown in FIGS. 5G-5J may be used in order to fabricate a structured layer 140 containing microfluidic components 130 over the artificial wafer of FIG. 5F (if no redistribution structure or RDL is desired to be placed in between the artificial wafer and the structured layer 140) or over the artificial wafer of FIG. 5G (if a redistribution structure or RDL is placed in between the artificial wafer and the structured layer 140), it is also possible to produce the artificial wafer of FIG. 5F or the artificial wafer plus RDL/redistribution structure of FIG. 5G and, in parallel, a structured layer 140 containing the entire microfluidic components 130 and then to combine these two structures to obtain an artificial wafer having a structured layer 140.

Figure 5K:
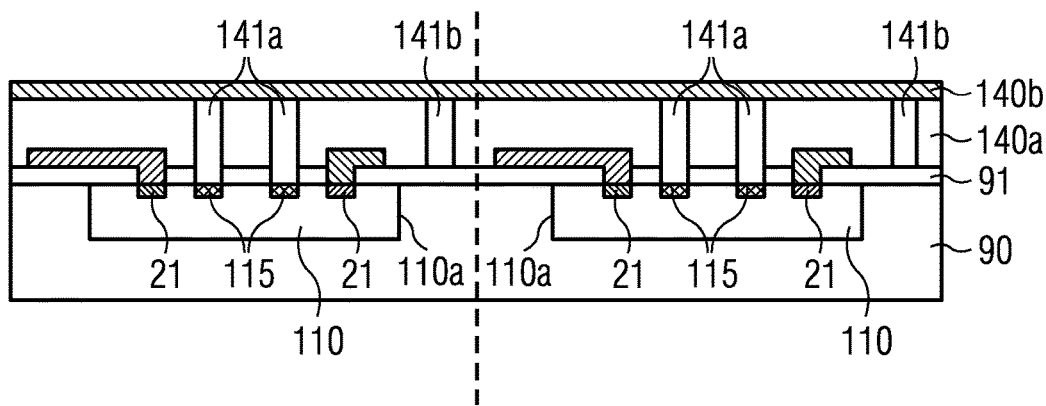

As illustrated in FIG. 5K by the dashed separation line, the devices 300 (see FIG. 9) are then separated from each other by separation of the encapsulant 90, the structured layer 140 (including, e.g., the microfluidic component layer 140a and the lid 140b) and possibly the redistribution structure 91, 202. Separation may be performed for example by sawing, cutting, etching or laser beam dicing.

In FIGS. 5H-5K, by way of example, the generation of the structured layer 140 containing microfluidic components 130 is exemplified on (artificial) wafer-level. However, it is also possible that the separation step is performed earlier in the fabrication process, e.g., after the fabrication of the artificial wafer as shown in FIG. 5F (i.e., the artificial wafer is separated) or after the application of the RDL/redistribution structure as shown in FIG. 5G (i.e., the artificial wafer plus the applied RDL/redistribution structure is separated). In these and other cases, the structured layer 140 comprising the microfluidic components 130 is applied on package-level (device-level). That is, each microfluidic device 100, 200, 300, 500, 600, 700 is then individually provided with an structured layer 140, 140a, 140b. In particular, such device-level processes for application of the structured layer 140, 140a, 140b may be appropriate if the separation step (e.g., the one shown in FIG. 5K) may be difficult because of the various materials involved or if the production of the structured layer 140, 140a, 140b on (artificial) wafer-level may be complicated for other reasons.

Figure 7:
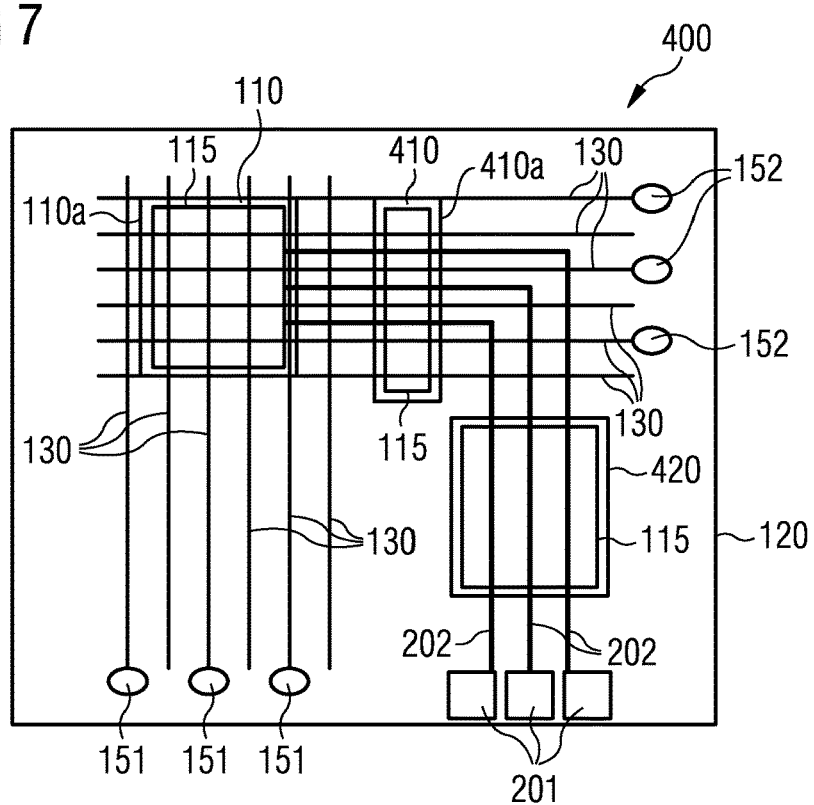
FIG. 7 schematically illustrates a top view on an exemplary microfluidic device showing the internal components thereof.

FIG. 7 illustrates an exemplary microfluidic device 400 comprising a plurality of semiconductor chips 110, 410, 420. By way of example, a first semiconductor chip 110 as described above, a second semiconductor chip 410 and, optionally, a third semiconductor chip 420 may be provided. All semiconductor chips 110, 410, 420 may be embedded in the encapsulation body 120 as described herein in relation with the first semiconductor chip 110. In particular, the multi-chip microfluidic device 400 may be fabricated the same way as described above in conjunction with FIGS. 5A-5K.

The semiconductor chips 110, 410, 420 may be different. In particular, they may comprise different integrated devices configured for different functions such as, e.g., sensing, actuating, flow controlling, heating etc. While some of the semiconductor chips (e.g., chips 110 and 410) may be connected to microfluidic components 130, other (e.g., chip 420) may not. Thus, one or more of the semiconductor chips may comprise an integrated device such as, e.g., an electronic integrated circuit but no microfluidic components 130.

Each semiconductor chip 110, 410, 420 may comprises one or more integrated devices selected from the group comprising a sensor, an actuator, an emitter (radiation, heat, light, etc), an integrated control logic and an integrated evaluation logic, etc. More specifically, the first semiconductor chip 110 may comprise an integrated device configured to interact with a microfluidic flow, e.g., a sensor to sense a microfluidic quantity (e.g., temperature, electric conductivity, optical characteristics, chemical or biological properties), and the second semiconductor chip 410 may comprise another integrated device configured to interact with a microfluidic flow, e.g., a MEMS actuator, in particular a micro-mechanical pump, a micro-mechanical valve, an emitter, etc. The first semiconductor chip 110 and the second semiconductor chip 410 may both be equipped with microfluidic components 130 associated or coupled with the integrated devices in order to sense the desired microfluidic quantity of the flow of fluid passing through such microfluidic component 130 (e.g., on chip 110) and/or to process control the flow of fluid passing through such microfluidic components 130 (e.g., on chip 410).

The integration of the second semiconductor chip 410 in the encapsulating body 120 may be identical as described in relation to semiconductor chip 110. Further, the arrangement of microfluidic components 130 extending over an upper surface of the second semiconductor chip 410 and the encapsulation body surface 121 may be identical as described in relation to semiconductor chip 110. That is, a microfluidic component 130 traversing an outline 410a of the upper surface of the second semiconductor chip 410 and a microfluidic component 130 traversing the outline 110a of the first semiconductor chip 110 may be fluidically interconnected. Further, the microfluidic components 130 associated with the second semiconductor chip 410 may be arranged in, above or beneath the same layer(s).

In other words, the microfluidic device 400 may comprise a microfluidic component 130 extending between the first semiconductor chip 110 and the second semiconductor chip 410 and configured to transport fluid between the first integrated device (e.g., sensor) of the first semiconductor chip and the second integrated device (e.g., actuator or emitter) of the second semiconductor chip.

Further, by way of example, the third semiconductor chip 420 may comprise an integrated control logic and/or an integrated evaluation logic. The third semiconductor chip 420 may be electrically coupled to the first semiconductor chip 110 and/or to the second semiconductor chip 410 via an electrical interconnect such as, e.g., conductor traces 202. The integrated control logic may, e.g., be configured to control the sensor on the first semiconductor chip 110 and/or the MEMS actuator on the second semiconductor chip 410. The integrated evaluation logic may, e.g., be configured to evaluate a sensor signal indicative of a sensed microfluidic quantity received from the sensor on the first semiconductor chip 110.

By combining a plurality of semiconductor chips of dedicated functionalities in a microfluidic device such as, e.g., microfluidic device 400, a highly modular and flexible design concept is obtained. The microfluidic device 400 may be composed of different semiconductor chips from, e.g., different providers, while the fluidic interconnect (e.g., microfluidic components 130 such as, e.g., channels) and/or the electrical interconnect (e.g., conductor traces 202) may be routed over low cost encapsulating material and may, e.g., be manufactured partly or completely by cost-effective wafer-level packaging (WLP) or eWLB (embedded Wafer-Level Ball Grid Array) processing. Thus, the required semiconductor area may be minimized and small batch production for specialized applications may become economically viable.

FIG. 8 illustrates a microfluidic device 500 comprising, e.g., a single semiconductor chip 110. The microfluidic device 500 may, e.g., be a reactor. The semiconductor chip 110 may comprise an integrated device which, by way of example, may be heater. The microfluidic component 130 which extends over the first main chip surface 111 and over the first main encapsulation body surface 121 may again be, e.g., a microfluidic channel. A microfluidic component 130a arranged over the active region 115 of the semiconductor chip 110 and thus over the heater (or, more generally, the integrated device) may, e.g., be a reactor chamber. The reactor chamber 130a and the microfluidic channels 130 are fluidically connected with each other. An electrical current is supplied to the heater via conductor traces 202 and external contact elements 201.

Further, microfluidic components in the form of, e.g., valves 501 may be provided. The valves 501 may, e.g., be situated over the encapsulation body 120 (i.e., laterally outside of the outline 110a of the semiconductor chip 110). The valves 501 may, e.g., be controlled by air pressure applied through air ducts 502 as known in the art. More specifically, such air ducts 502 may pass through a control layer situated on top of the structured layer 140 or the microfluidic component layer 140a. In this case, at least some of the microfluidic components (in particular the valves 501) may extend over both layers, i.e., may have a control portion located in the control layer and may have a fluidic transport portion located in the structured layer 140 or the microfluidic component layer 140a. Air Ports 161 may be provided to apply air pressure to the air ducts 502 in order to operate the valves 501.

The structured layer 140 and/or the microfluidic component layer 140a may be referred to as a "flow layer." It is to be noted that the concept of a "control layer" overlaying the "flow layer" as described above and exemplified in FIG. 8 may apply to all devices 100, 200, 300, 400, 500, 600, 700 disclosed herein.

Figure 10:
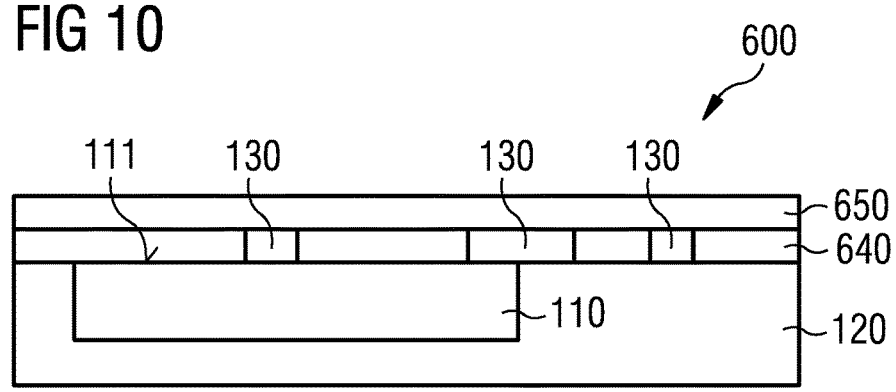
FIG. 10 schematically illustrates a partial cross-sectional view of an exemplary microfluidic device.
Figure 11:
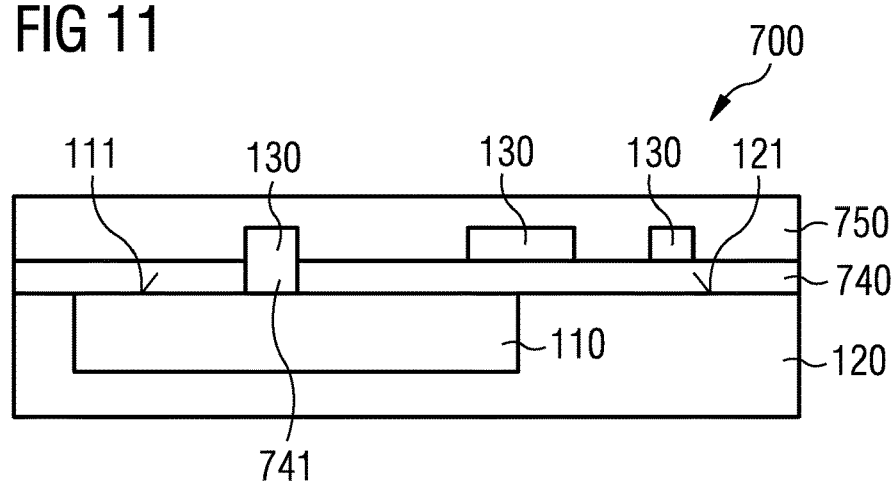
FIG. 11 schematically illustrates a partial cross-sectional view of an exemplary microfluidic device.

FIGS. 10 and 11 schematically illustrate two partial cross-sectional views of exemplary microfluidic devices 600 and 700, respectively. The concepts and principles explained with regard to FIGS. 10 and 11 may apply to all embodiments disclosed herein.

FIG. 10 illustrates a microfluidic device 600 comprising a semiconductor chip 110 (and possibly further semiconductor chips not shown in FIG. 10) embedded in an encapsulation body 120, a structured layer 640 containing the microfluidic components 130 and a lid 650 closing the structured layer 640 at the top. The structured layer 640 may be a dielectric layer. By way of example, the structured layer 640 may be a polymer layer of redistribution structure/RDL. In this case, the structured layer 640 may correspond to layer 140a of microfluidic device 300, and reference is made to the corresponding description to avoid reiteration. Further, the lid 650 closing the structured layer 640 may, e.g., comprise or be made of glass or a polymer layer. It may, e.g., correspond to layer 140b of microfluidic device 300, and reference is made to the corresponding description to avoid reiteration. As described above, it is also possible that a "control layer" is arranged above the structured layer 640, wherein the "control layer" may contain control portions of the microfluidic components 130 arranged in the structured layer 640 (i.e., the "flow layer").

Referring to FIG. 11 a microfluidic device 700 is illustrated. The microfluidic device 700 may comprise a semiconductor chip 110 (and possibly further semiconductor chips not shown in FIG. 11) embedded in an encapsulation body 120, a dielectric layer 740 extending over the first main chip surface 111 and over the first main encapsulation body surface 121 and a lid 750 extending over the dielectric layer 740. The dielectric layer 740 may be made of the same materials as the structured layer 640, e.g., a dielectric material such as, e.g., a photoresist, an imid, SU8, etc. Further, similar to FIG. 10, it may be a polymer layer (e.g., the upper polymer layer) of a redistribution structure/RDL. However, in this example, the dielectric layer 740 does not contain the microfluidic components 130.

The microfluidic components 130, e.g., microfluidic channels, microfluidic valves, microfluidic multiplexors, microfluidic mixers, microfluidic reaction chambers, microfluidic buffers, microfluidic networks etc., are formed in the recess-structured lid 750 extending above the dielectric layer 740. Thus, in this example, the lid 750 comprises the "flow layer." The lid 750 may, e.g., comprise or be made of an elastomer such as, e.g., PDMS, glass or a polymer layer.

The dielectric layer 740 extends over the first main chip surface 111 and the first main encapsulation body surface 121 and beneath the lid 750. If appropriate, the dielectric layer 740 may have one or more openings 741 aligned to one or more recess structures (i.e., a microfluidic component 130) in the lid 750 to allow the fluid routed in the lid 750 to come into contact with the active area 115 of the semiconductor chip 110.

Again, a "control layer" (not shown) may be arranged on top of the "flow layer." In this example, the "control layer" may be located in an additional layer (not shown) above the lid 750 or in an upper region of the lid 750 overlaying a lower region of the lid 750 in which the microfluidic components 130 or at least the fluidic transport portions thereof are formed. In this connection, to avoid reiteration, reference is made to disclosure above.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. Furthermore, to the extent that the terms "include," "have," "with" or other variants thereof are used in either the detailed description or the claims, such terms are intended to be inclusive in a manner similar to the term "comprise." Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A microfluidic device comprising:
a first semiconductor chip having a first main chip surface;
a molded, laminated or plastic encapsulation body embedding the first semiconductor chip, the encapsulation body having a first main encapsulation body surface, wherein the first main encapsulation body surface is level with the first main chip surface;
a first microfluidic channel extending over the first main chip surface and over the first main encapsulation body surface and traversing an outline of the first main chip surface, wherein the first microfluidic channel is oriented parallel to the first main chip surface and the first main encapsulation body surface; and
an electrical redistribution structure extending over the first main chip surface and over the first main encapsulation body surface and traversing the outline of the first main chip surface.

2. The microfluidic device of claim 1, wherein the first main chip surface and the first main encapsulation body surface are laterally adjacent to each other.

3. The microfluidic device of claim 1, wherein the outline of the first main chip surface comprises a transition line delimiting the first main chip surface from the first main encapsulation body surface.

4. The microfluidic device of claim 1, wherein the first semiconductor chip comprises a sensor, an actuator, an emitter, an integrated control logic, or an integrated evaluation logic.

5. The microfluidic device of claim 1, further comprising a first layer extending over the first main chip surface and the first encapsulation body surface, wherein the first microfluidic channel is at least partly formed within the first layer.

6. The microfluidic device of claim 5, wherein the first layer comprises a material selected from the group consisting of a dielectric material, a photoresist, an elastomer, a ceramic-like material, and glass.

7. The microfluidic device of claim 5, further comprising a second layer extending over the first layer, wherein the first microfluidic channel is partly formed within the first layer and is partly formed within the second layer.

8. The microfluidic device of claim 7, wherein a fluidic transport portion of the first microfluidic channel is formed within the first layer, and wherein a control portion of the first microfluidic channel configured to control fluidic transport through the fluidic transport portion is formed within the second layer.

9. The microfluidic device of claim 1, further comprising a second semiconductor chip embedded in the encapsulation body, the second semiconductor chip comprising a sensor, an actuator, an emitter, an integrated control logic, or an integrated evaluation logic.

10. The microfluidic device of claim 9, further comprising a second microfluidic component extending over a first main chip surface of the second semiconductor chip and over the first main encapsulation body surface and traversing an outline of the first main chip surface of the second semiconductor chip, wherein the first microfluidic channel and the second microfluidic component are fluidically interconnected.

11. The microfluidic device of claim 10, further comprising a first layer extending over the first main chip surface of the first semiconductor chip, the first main chip surface of the second semiconductor chip and the first encapsulation body surface, wherein the first microfluidic channel and the second microfluidic component are at least partly formed within the first layer.

12. A microfluidic device comprising:
a first semiconductor chip having a first main chip surface;
an encapsulation body embedding the first semiconductor chip, the encapsulation body having a first main encapsulation body surface;
a first microfluidic channel extending over the first main chip surface and over the first main encapsulation body surface and traversing an outline of the first main chip surface, wherein the first microfluidic channel is arranged in a material layer made of an elastomer; and
an electrical redistribution layer arranged directly on the first main chip surface and the first main encapsulation body surface.

13. The microfluidic device of claim 12, wherein the first semiconductor chip comprises an integrated device configured to interact with a microfluidic fluid passing through the first microfluidic channel.

14. A microfluidic device comprising:
a first semiconductor chip having a first main chip surface;
a molded, laminated or plastic encapsulation body embedding the first semiconductor chip, the encapsulation body having a first main encapsulation body surface, wherein the first main encapsulation body surface is level with the first main chip surface; and
a first microfluidic channel extending over the first main chip surface and over the first main encapsulation body surface and traversing an outline of the first main chip surface;
wherein the first main channel is oriented parallel to the first main chip surface and the first main encapsulation body surface; and
wherein the first semiconductor chip comprises an integrated device configured to interact with a microfluidic fluid passing through the first microfluidic channel.

15. The microfluidic device of claim 14, further comprising an electrical redistribution structure extending over the first main chip surface and over the first main encapsulation body surface and traversing the outline of the first main chip surface.

16. The microfluidic device of claim 14, further comprising a first layer extending over the first main chip surface and the first encapsulation body surface, wherein the first microfluidic channel is at least partly formed within the first layer.

17. The microfluidic device of claim 16, further comprising a second layer extending over the first layer, wherein the first microfluidic channel is partly formed within the first layer and is partly formed within the second layer.

18. The microfluidic device of claim 14, further comprising a second semiconductor chip embedded in the encapsulation body.

19. The microfluidic device of claim 18, further comprising a second microfluidic component extending over a first main chip surface of the second semiconductor chip and over the first main encapsulation body surface and traversing an outline of the first main chip surface of the second semiconductor chip, wherein the first microfluidic channel and the second microfluidic component are fluidically interconnected.

20. The microfluidic device of claim 19, further comprising a first layer extending over the first main chip surface of the first semiconductor chip, the first main chip surface of the second semiconductor chip and the first encapsulation body surface, wherein the first microfluidic channel and the second microfluidic component are at least partly formed within the first layer.

* * * * *